United States Patent [19]

Wuu et al.

[11] Patent Number: 5,578,528
[45] Date of Patent: Nov. 26, 1996

[54] METHOD OF FABRICATION GLASS DIAPHRAGM ON SILICON MACROSTRUCTURE

[75] Inventors: Dong-Sing Wuu, Hsinchu; Tzung-Rue Hsieh, Miao-Li Hsien; Hui-Fen Wu, Kao-Hsiung Hsien; Cuo-Lung Lei, Tao-Yuan Hsien, all of Taiwan

[73] Assignee: Industrial Technology Research Institute, Hsinchu Hsien, Taiwan

[21] Appl. No.: 432,727

[22] Filed: May 2, 1995

[51] Int. Cl.$^6$ ............................ G01L 9/00; G01L 9/08; H01L 21/465; H01L 21/316
[52] U.S. Cl. ...................... 437/228; 437/238; 437/240; 437/901; 437/927; 437/921; 73/777; 73/754; 148/DIG. 73; 156/662.1; 361/283.2; 361/283.4; 310/324
[58] Field of Search .................. 73/777, 754; 437/228, 437/238, 240, 901, 921, 927; 148/DIG. 73; 156/662.1; 361/283.2, 283.4; 310/324

[56] References Cited

U.S. PATENT DOCUMENTS

| | | | |
|---|---|---|---|
| 4,664,762 | 5/1987 | Hirata | 204/129.3 |
| 4,872,945 | 10/1989 | Myers et al. | 156/627 |
| 5,177,661 | 1/1993 | Zarracky et al. | 361/283 |
| 5,189,591 | 2/1993 | Bernot | 361/283 |
| 5,242,863 | 9/1993 | Xiang-Zheng et al. | 437/228 |
| 5,245,504 | 9/1993 | Bullis et al. | 361/283.4 |
| 5,279,162 | 1/1994 | Takebe et al. | 73/726 |
| 5,307,684 | 5/1994 | Moss et al. | 73/716 |
| 5,310,441 | 5/1994 | Tsutsumi et al. | 156/382 |
| 5,335,550 | 8/1994 | Satou | 73/727 |
| 5,343,756 | 9/1994 | Nakamura et al. | 73/718 |

FOREIGN PATENT DOCUMENTS 63-311147  12/1988  Japan.
06163941   6/1994   Japan.

OTHER PUBLICATIONS

Michael A. Huff et al. "Design of Sealed Cavity Microstructures Formed by Silicon Wafer Bonding" Journal of Microelectromechanical Systems, vol. 2, No. 1, Jun. 1993, pp. 74–81.

*Primary Examiner*—Robert Kunemund
*Assistant Examiner*—Matthew Whipple
*Attorney, Agent, or Firm*—W. Wayne Liauh

[57] ABSTRACT

A method for fabricating microelectromechanical systems containing a glass diaphragm formed on a silicon macrostructure is disclosed. The method comprises the steps of: (a) obtaining a silicon wafer and forming a cavity in the silicon wafer; (b) using a flame hydrolysis deposition technique to deposite glass soot into the cavity, the glass soot fills the cavity and extends onto the external surface of the silicon wafer so as to form a glass soot layer having a predetermined thickness; and (c) heat-consolidating the glass soot at temperatures between 850° and 1,350° C. so as to cause the glass soot to shrink and form a glass diaphragm over the cavity. The shrinkage ratio between the glass diaphragm and the glass soot layer is between 1:20 to 1:50. The silicon wafer can be further fabricated to contain a diaphragm-sealed cavity and/or a diaphragm-converted cantilever.

14 Claims, 3 Drawing Sheets

METHOD OF FABRICATION GLASS DIAPHRAGM ON SILICON MACROSTRUCTURE

FIELD OF THE INVENTION

The present invention relates to methods for fabricating glass diaphragms on a silicon macrostructure. More specifically, the present invention relates to methods for fabricating glass diaphragms and/or glass diaphragm-sealed chambers for use in microelectromechanical systems, such as pressure transducers, microvalves, accelerometers, shear-stress sensors, etc.

BACKGROUND OF THE INVENTION

Recently, the technology related to "silicon micromachining" has been developed into a family of new applications for making "microelectromechanical systems (MEMS)". This evolving technology has attracted great attention, and is considered another commercially explosive main stream after the semiconductor industry. It has been documented in the art that a diaphragm can be formed on a silicon macrostructure. The diaphragm so formed, or other diaphragm-derived components such as a diaphragm-sealed chamber or a diaphragm-based suspending arm, can be widely used in the industry for manufacturing pressure transducers, microvalves, actuators, accelerometers, shear-stress sensors, etc.

FIG. 1 is a schematic illustration of the steps of one of the conventional methods utilizing the bulk micromachining technique to fabricate a pressure sensor. FIG. 1 shows that a silicon sensing wafer 1 is bonded to a silicon constraint wafer 2 via a SFB (silicon :fused bonding) bond. The surfaces of the wafers to be bonded together have been treated to become hydrated surface so as to effectuate the wafer bonding therebetween. Prior to the bonding step, the silicon constraint wafer is formed with an anisotropically etched cavity 3. Thereafter, the silicon sensing wafer is etched to form a diaphragm 4 having an etched-back surface 8, opposite the fused interface 5. Ion-implanted piezoresistors 6 are formed on the diaphragm 4. Finally, the silicon constraint wafer is ground and polished for final wafer thickness. The conventional method requires a silicon wafer bonding step, which requires that the surfaces of both wafers be extremely clean. Furthermore, two polishing steps are required in the conventional method. Typically, an etch stop 7 is required to ensure the etching of the silicon sensing wafer to a predetermined thickness. This further adds to the cost for manufacturing semiconductor sensors.

As discussed above, one of the disadvantages of the silicon micromachining processes in making diaphragms for use in microelectromechanical systems is that the silicon wafers to be bonded must have extremely clean surface. Additionally, the conventional silicon micromachining processes may also involve the additional steps of forming an etching stop and performing a double-sided aligning procedure, which is a complicated and expensive procedure. Therefore, it is desirable to develop new silicon micromachining processes for making diaphragms which would require simplified fabricating procedure and is compatible with many other IC manufacturing processes and/or applications.

The following patents, whose contents are expressly incorporated herein by reference, provide some background information which may be relevant to the present invention.

U.S. Pat. No. 5,307,684 discloses generally a pressure transducer for measuring the pressure of a fluid in which a diaphragm capable of displacement is located within a cavity provided in a housing. The '684 patent further discloses a stop mechanism for increasing; the bursting pressure limit of the diaphragm for protection against calibration damage.

U.S. Pat. No. 4,664,762 discloses a method of electrochemically etching a silicon substrate of a diaphragm type silicon pressure sensor by etching one layer of a dual-layer silicon substrate having a first N-type silicon layer and a second P-type silicon layer. The substrate is first placed in an etchant and an electrode is formed on each of the first and second layers. A positive terminal of a voltage source is connected to the electrode of the N-type silicon layer, and a switch is provided which selectively connects the positive terminal to the P-type silicon layer. When the etching of the P-type silicon layer is nearly complete, the switch is opened to disconnect the P-type silicon layer from the positive terminal.

U.S. Pat. No. 5,310,441 discloses a method for automatically binding a silicon wafer to a carrier plate, which is used in a silicon wafer polishing apparatus. The silicon wafer is a monocrystal silicon wafer, and a fixed carrier plate is bonded to a plurality of wafer sheets. The carrier plate is casted into a polishing apparatus to carry out the polishing of the monocrystal silicon wafer. Typically wax is applied to the inside of the wafer as a bonding agent.

U.S. Pat. No. 5,189,591 discloses a capacitive pressure transducer which is made of aluminosilicate glass or any other glass having a low thermal coefficient. The capacitive pressure transducer comprises segments of aluminosilicate glass. One of the segments is first shaped into a pressure diaphragm, and a first electrode is formed on the surface of the pressure diaphragm. Then another segment is shaped into a second diaphragm and a second electrode is formed on the surface of the second diaphragm. Finally the pressure and second diaphragms are bonded together such that the first and second electrodes are formed into a capacitor.

U.S. Pat. No. 4,872,945 discloses a process for manufacturing the pressure transducer of a pressure sensor. A capacitive pressure transducer is first formed by bonding a silicon diaphragm to a glass base such that a cavity is formed between the diaphragm and the base, and the transducer produces different capacitances in response to different diaphragm deflections. The sensitivity of the capacitive pressure transducer is adjusted by etching the silicon diaphragm while it is bonded to the base substrate in accordance with capacitance values of the transducer. The thickness of the silicon diaphragm can be selectively reduced to obtain an accurate desired sensitivity for the transducer.

U.S. Pat. No. 5,242,863 discloses a method for fabricating a pressure sensor, which is made up of a substrate of which there is a diaphragm at or near the surface of the substrate with a chamber under the diaphragm, by first forming a low resistance N-type silicon layer buried under an overlying layer designed to be a diaphragm, and forming a low resistance N-type :material filled trench which penetrates the overlying layer and connects with the low resistance N-type silicon layer. The low resistance N-type material and the low resistance N-type silicon layer are converted into porous silicon by anodization of the silicon. Then the porous silicon is removed by an etching step. Finally the openings in the trench which are, formed after the removal of the porous silicon are filled with a sealing material to form a sealed reference chamber.

U.S. Pat. No. 5,177,661 discloses method for the fabrication of diaphragm pressure sensors utilizing the silicon-on-insulator (SOI) technology where recrystallized silicon forms a diaphragm which incorporates electronic devices used in monitoring pressure. The diaphragm is alternatively comprised of a silicon nitride having the necessary mechanical properties with a recrystallized silicon layer positioned thereon to provide pressure sensor electronics. In this method, a compliant membrane is formed that encloses a sacrificial insulating material. The insulating material is subsequently removed through an opening in the membrane to form a pressure sensitive diaphragm. Electrical elements are positioned in a single crystal silicon layer formed on or in the diaphragm to detect movements thereof and produce electrical signals proportional to the diaphragm displacement. The single crystal layer is formed by depositing a polycrystalline silicon layer and then zone-melt recrystallizing the film to form a high quality single crystal silicon suitable for CMOS circuitry.

U.S. Pat. No. 5,279,162 discloses a semiconductor sensor containing an elastically deformable member, a field-effect transistor formed in a piezoelectric semiconductor material supported on the elastically deformable member, means for supplying a gate of the field-effect transistor with a predetermined DC bias, and a constant-current supply means for supplying a predetermined drain current to a drain of the field-effect transistor. In this invention,, semi-conductors of high piezoelectricity, such as GaAs, etc, are used in place of the conventionally used silicon.

U.S. Pat. No. 5,335,550 discloses a semiconductor pressure sensor containing a flat thin diaphragm formed by bonding a first silicon substrate and a second silicon substrate with an interface insulating film interposed therebetween. A circuitry including gauge resistors is fabricated on the primary surface of the second silicon substrate. The interface insulating film is disposed in the recess of a vacuum chamber and has a two-layer structure..Alignment marks are formed so as to allow the circuitry to be accurately formed relative to the vacuum chamber.

U.S. Pat. No. 5,245,504 discloses a method for manufacturing hinged diaphragms for semiconductor sensors, such as accelerometers, pressure transducers, etc, from a SIMOX wafer, in which an internal insulating silicon dioxide layer is used as an etch stop in removing silicon from the underside of the wafer by etching with an appropriately selected etch, so as produce reduced thickness peripheral hinged areas, with the exposed part of the silicon dioxide layer being removed in a subsequent etching step using a different, selective etch. The inventors claimed that their invention produced a single layer, single-crystal, silicon hinge of uniform, continuous material, which enhances the linearity of the diaphragm movement during use and the sensor's sensitivity and accuracy.

SUMMARY OF THE INVENTION

The primary object of the present invention is to develop a micromachining method for fabricating glass diaphragm(s) on a silicon macrostructure. More specifically, the primary object of the present invention is to develop a cost-effective and relatively simplified method, by which glass diaphragm(s) can be directly fabricated on a silicon macrostructure. The method disclosed in the present invention is compatible with the monolithic IC fabrication process by which all the components are fabricated on a single silicon wafer in the same fabrication process. The glass diaphragm fabricated using the method disclosed in the present invention can be utilized in a wide spectrum of industrial applications, for example, they can be advantageously used in conjunction with various piezo resistors for use in making pressure transducers or sensors, or in making suspended arms (i.e., of the cantilever type) for use in various accelerometers, etc.

The method disclosed in the present invention is most advantageous in fabricating glass diaphragms or glass diaphragm-sealed cavities on a silicon macrostructure. In the method disclosed in the present invention, glass soot is deposited, preferably using the flame hydrolysis deposition technique, into a cavity that has been formed on a silicon wafer, and further onto the external surface of the silicon wafer above the cavity. After high temperature consolidation, the volume of the glass soot will shrink considerably (to about 1/20 to 1/50 of its original volume). The surface tension resulting from the cohesive force of the consolidating glass soot will cause a thin film, i.e., a glass diaphragm, to be formed above the cavity after the glass soot is densified. The present invention thus allows a transparent diaphragm to be formed on a silicon macrostructure without the expensive wafer bonding step nor the double wafer polishing step, both of these steps are required in the conventional processes for making semiconductor sensors.

The main reaction during the flame hydrolysis deposition step is $SiCl_4 + 2H_2O \rightarrow SiO_2 + 4HCl$. $BBr_3$ (or $BCl_3$) and $PCl_3$ (or $POCl_3$) can be added to the reaction stream to lower the consolidation temperature of the glass soot forming the glass diaphragm. Preferably, the glass soot fillings are prepared such that they can be effectively consolidated at temperatures between 850 and 1,350° C. During the consolidation process, during which the volume of the glass soot will shrink to between 1/20 and 1/50 of its original volume, gas will invade into the cavity formed in the silicon wafer. The invading gas and the densification of the glass soot together would cause the glass soot filling to be separated and removed from the cavity so as to form the diaphragm above the cavity. The silicon wafer can be further fabricated to form diaphragm-sealed cavity or cantilever-based microelectromechanical systems. Alternatively, the diaphragm-sealed cavity can be directly formed during the consolidation process.

BRIEF DESCRIPTION OF THE DRAWING

The present invention will be described in detail with reference to the drawings showing the preferred embodiment of the present invention, wherein.

DETAILED DESCRIPTION OF THE PREFERRED EMBODIMENT

The present invention discloses a method for fabricating glass diaphragm(s) on a silicon macrostructure. The method disclosed in the present invention is compatible with the monolithic IC fabrication process by which all the components are fabricated on a single silicon wafer in the same fabrication process. The method disclosed in the present invention is most advantageous in fabricating one or more glass diaphragms, glass cantilevers, or glass diaphragm-sealed cavities on a silicon macrostructure. In the method disclosed in the present invention, glass soot is deposited, preferably using the flame hydrolysis deposition technique, into a cavity that has been formed on a silicon wafer and further onto the external surface of the silicon wafer. After high temperature consolidation (i.e., sintering), the volume of the glass soot will shrink considerably (to about 1/20 to 1/50 of its original volume). The surface tension resulting from the cohesive force of the consolidating glass soot will cause a thin film, i.e., a glass diaphragm, to be formed above the cavity when the glass soot is densified. The present invention presents several distinct advantages over the prior art methods in that, among other advantages, it allows a transparent diaphragm to be formed on a silicon macrostructure without the expensive wafer bonding step or the double wafer polishing step. The success of the wafer bonding step, which is required in the prior art processes, is critically sensitive to the surface treatment of the silicon wafers to be bonded. Extremely clean surface is required in the wafer bonding step, thus, very high fabricating cost is involved.

Figure 1:
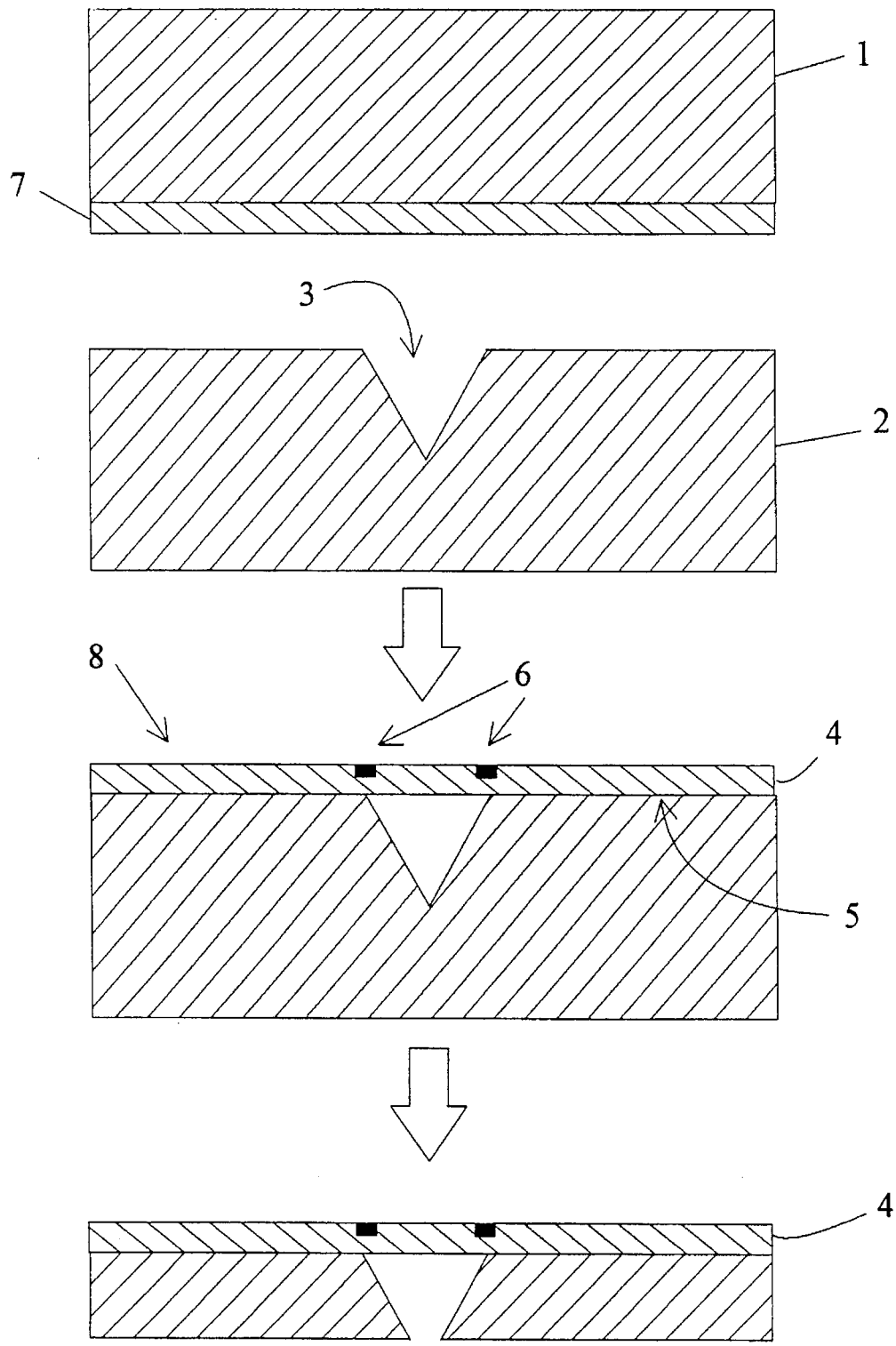
FIG. 1 is a schematic illustration of the steps of one of the conventional methods utilizing the bulk micromachining technique to fabricate pressure sensor.
Figure 2:
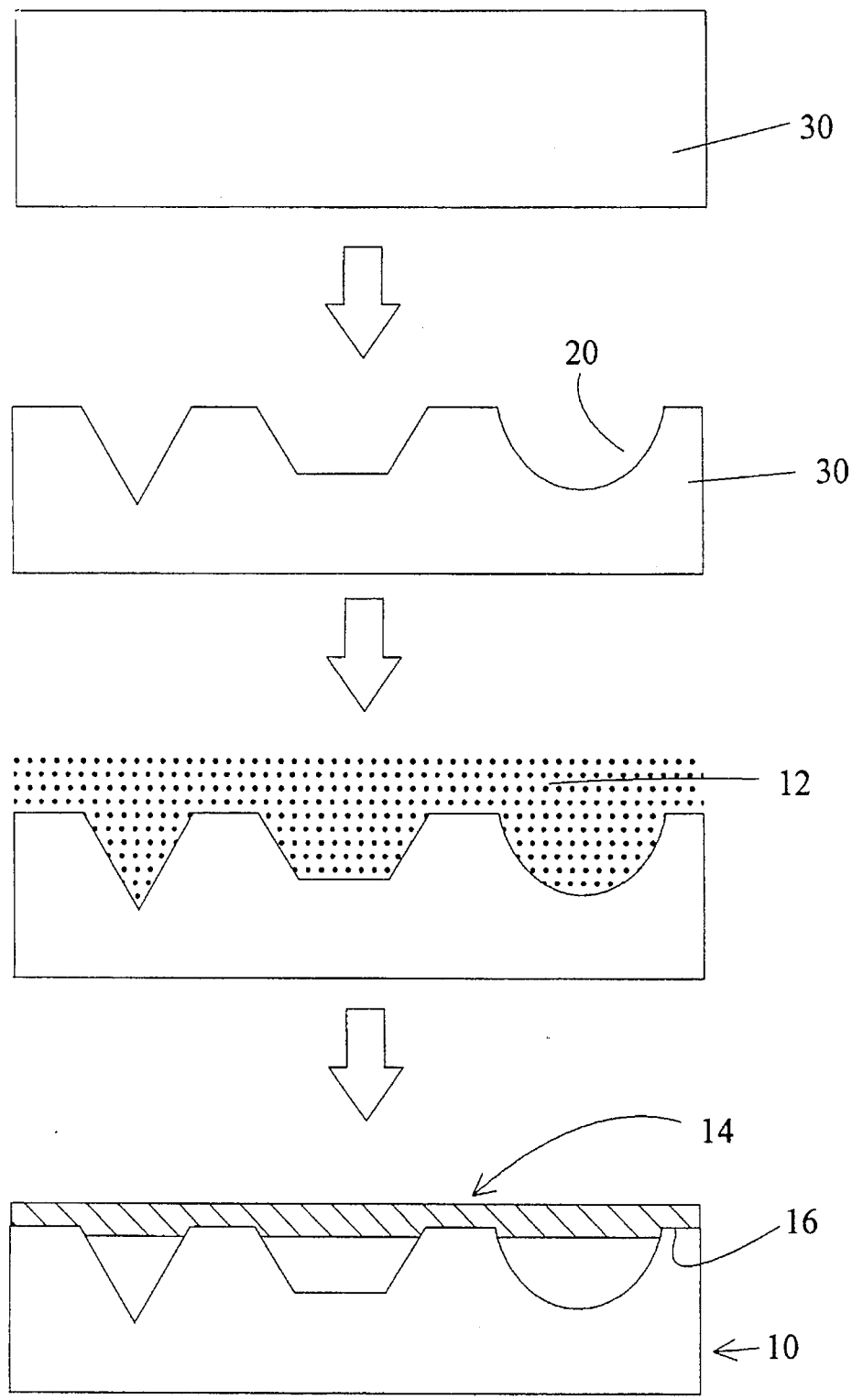
FIG. 2 is a schematic illustration of the steps in forming glass diaphragms on a silicon macrostructure according to a preferred embodiment of the present invention in which glass soot fillings are deposited inside cavities formed in a silicon wafer, and then glass diaphragms are fabricated by consolidation of the glass soot at elevated temperatures.

FIG. 2 is a schematic illustration of the steps in forming glass diaphragms on a silicon macrostructure according to a preferred embodiment of the present invention. As shown in FIG. 2, a silicon wafer 30 is first obtained. Then cavities 20 are formed in the silicon wafer 30 using typical anisotropical etching method. In step 3, glass soot 12 is deposited inside cavities 20 formed in the silicon wafer 30, and further onto the external surface of the silicon wafer above the cavity. The main reaction during the flame hydrolysis deposition step is $SiCl_4 + 2H_2O \rightarrow SiO_2 + 4HCl$. Preferably, $BBr_3$ (or $BCl_3$) and $PCl_3$ (or $POCl_3$) are added to the reaction mixture stream to lower the consolidation temperature of the glass soot so formed. After the flame hydrolysis deposition step, the glass soot 12 and the silicon water 30 are consolidated at temperatures between 850 and 1,350° C.

In a preferred embodiment of the process disclosed in the present invention, the cavity is connected to the outside environment and gas will invade into the cavity 20 formed in the silicon wafer 30 during the consolidation process, during which the volume of the glass soot will shrink to between 1/20 and 1/50 of its original volume,. The densification of the glass soot together with the invading gas will cause the glass soot filling to be separated (i.e., lifted up) and removed from the bottom of the cavity so as to form a microelectomechanical component 10 having a diaphragm 14 extending over the top of the cavity 20. A strong Si—SiO₂ bonding between the portion of the consolidated glass soot 16 and the silicon wafer 30, is formed during the consolidation step. The silicon wafer can be further fabricated to form diaphragm-sealed cavity or cantilever based microelectromechanical systems. Alternatively, the diaphragm-sealed cavity can be directly formed during the consolidation process.

The present invention will now be described more specifically with reference to the following example. It is to be noted that the following descriptions of examples, including the preferred embodiment of this invention, are presented herein for purposes of illustration and description, and are not intended to be exhaustive or to limit the invention to the precise form disclosed.

A 3-inch silicon wafer having a thickness of about 380 µm was obtained. As shown in FIG. 2, a V-groove was formed on the silicon wafer using typical anisotropical etching technique, which involved the reaction of KOH+IPA+H₂O, at 85° C.

Using the flame hydrolysis deposition technique, a glass soot layer of 420 µm was deposited on the silicon wafer. The glass soot also filled the cavity in the silicon wafer. The components used in the flame hydrolysis deposition technique are shown in Table 1 below.

TABLE 1

| | |
|---|---|
| $H_2$ | 10.5 l/min |
| $O_2$ | 21 l/min |
| $SiCl_4$ (20 °C.) | 500 c.c./min |
| $BBr_3$ (30 °C.) | 200 c.c./min |
| $POCl_3$ (20 °C.) | 60 c.c./min |

The silicon wafer containing the glass soot was placed inside a high-temperature oven, inside which the glass soot was consolidated at a consolidation temperature of about 1,200° C. After consolidation, the silicon wafer was removed from the oven. A transparent glass diaphragm was formed over the top of the cavity and extended onto the surface of the silicon wafer. The transparent glass diaphragm was measured to have a thickness of about 20 µm. This indicates a shrinkage factor of more than 95% (i.e., the glass soot was shrunk to 1/21 of its original thickness). A strong Si—SiO₂ bonding between the consolidated portion of the glass soot 16 and the silicon wafer, was formed during the consolidation step.

Figure 3B:
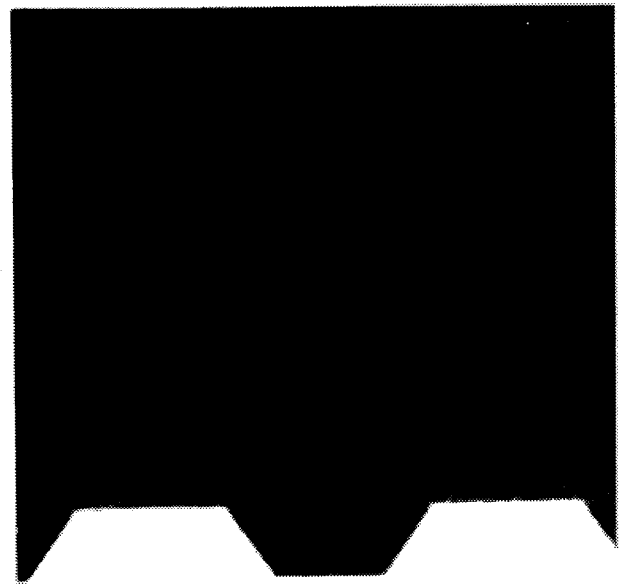
FIG. 3b is a photograph (X 200) of the silicon wafer after sintering which shows that the glass soot has formed into a diaphragm covering the V-groove; the thickness of the diaphragm is 20 µm, indicating a shrinkage to 1/21 of its original thickness.
Figure 3A:
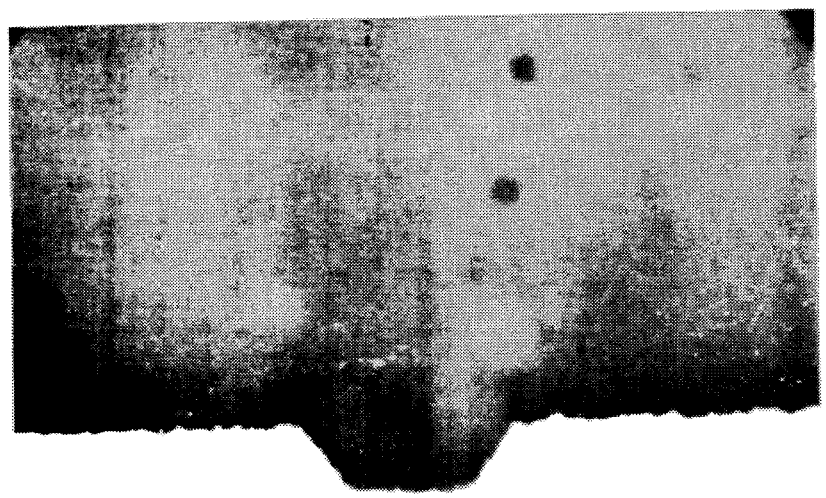
FIG. 3a is a photograph (X 200) showing a silicon wafer having a V-groove filled with glass soot, the thickness of the silicon layer is 380 μm and the thickness of the glass soot, which is contiguous with the glass soot filling in the cavity, is 420 μm.

FIG. 3a is a photograph (X 200) showing a silicon wafer having a V-groove filled with glass soot, the thickness of the silicon layer was 380 µm and the thickness of the glass soot, which was contiguous with the glass soot filling, was 420 µm. FIG. 3b is a photograph (X 200) of the silicon wafer after the consolidation step. FIG. 3b shows that the glass soot has been formed into a diaphragm covering the V-groove; the thickness of the diaphragm is 20 µm, indicating a shrinkage of the glass soot to 1/21 of its original thickness.

The diaphragms made from the above steps can be further fabricated so that they can be used in making amplifiers, wheatstone bridges, etc. Also, the diaphragm can be etched into various surface patterns for a wide type of other applications. Additionally, other microelectromechanical systems can be made by using the glass diaphragm prepared according the method disclosed in the present invention as a sacrifice layer. Therefore, not only that the method disclosed in the present invention can be integrated into monolithic IC fabrication, it can also be used in fabricating a wide spectrum of microelectromechanical systems.

Another advantage of the method disclosed in the present invention is that a wide range of microelectromechanical systems can be fabricated without requiring the wafer bonding step. Since the wafer bonding step requires critical surface treatment, which can be very expensive, the present invention can substantially lower the cost of microelectromechanical systems by lowering the fabricating cost and by improving acceptance ratio. The method disclosed in the present invention also eliminates the need for an expensive dual-surface alignment polishing device, which is required in the wafer bonding process. This would result in further reduction of the cost for fabricating microelectromechanical systems.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a glass diaphragm on a silicon macrostructure comprising the steps of:
   (a) obtaining a silicon wafer and forming a cavity in said silicon wafer;
   (b) depositing a glass soot into said cavity and filling said cavity, said glass soot also being deposited in a contiguous manner over an external surface of said silicon wafer above said cavity so as to form a glass soot layer having a thickness;
   (c) heat-consolidating said glass soot at temperatures between 850 and 1,350° C. so as to cause said glass soot to shrink and form a glass diaphragm over said cavity.

2. A method for fabricating a glass diaphragm on a silicon macrostructure according to claim 1 wherein said glass soot is deposited into said cavity using a flame hydrolysis deposition technique.

3. A method for fabricating a glass diaphragm on a silicon macrostructure according to claim 2 wherein said flame hydrolysis deposition technique involves the following reaction:

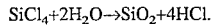

$SiCl_4 + 2H_2O \rightarrow SiO_2 + 4HCl$.

4. A method for fabricating a glass diaphragm on a silicon macrostructure according to claim 3 wherein said reaction involves a reactant stream which comprises the components of hydrogen, oxygen, and $SiCl_4$.

5. A method for fabricating a glass diaphragm on a silicon macro structure according to claim 4 wherein said reactant stream further comprises $BBr_3$ or $BCl_3$.

6. A method for fabricating a glass diaphragm on a silicon macrostructure according to claim 4 wherein said reactant stream further comprises $PCl_3$ or $POCl_3$.

7. A method for fabricating a glass diaphragm on a silicon macrostructure according to claim 4 wherein said reactant stream further comprises a boron compound selected from the group consisting of $BBr_3$ and $BCl_3$ and a phosphorus compound selected from the group consisting of $PCl_3$ and $POCl_3$.

8. A method for fabricating a glass diaphragm on a silicon macrostructure according to claim 1 wherein said cavity is formed on said silicon wafer by an anisotropic etching method using an etchant containing KOH, IPA and $H_2O$, at a temperature of about 85° C.

9. A method for fabricating a glass diaphragm on a silicon macrostructure according to claim 1 wherein said cavity is a V-shaped groove.

10. A method for fabricating a glass diaphragm on a silicon macrostructure according to claim 1 wherein said cavity has a round-bottomed shape.

11. A method for fabricating a glass diaphragm on a silicon macrostructure according to claim 1 wherein said cavity has a trapezoidal shape.

12. A method for fabricating a glass diaphragm on a silicon macrostructure according to claim 1 wherein said glass soot layer is shrunk by a factor from about 20 to about 50 after said heat consolidating step.

13. A method for fabricating a glass diaphragm on a silicon macrostructure according to claim 1 which further comprises the step of fabricating said silicon wafer to form a diaphragm-sealed cavity or a diaphragm-converted cantilever.

14. A method for fabricating a glass diaphragm on a silicon macrostructure according to claim 1 which further comprises the step of etching a pattern on said glass diaphragm after said glass diaphragm is formed.

* * * * *